MICROWAVE SEMICONDUCTOR AMPLIFIER

Filed April 19, 1967

5 Sheets-Sheet 1

Sept. 10, 1968 MASAO SUMI 3,401,347

MICROWAVE SEMICONDUCTOR AMPLIFIER

Filed April 19, 1967 5 Sheets-Sheet 3

United States Patent Office 3,401,347

Patented Sept. 10, 1968

3,401,347

MICROWAVE SEMICONDUCTOR AMPLIFIER

Masao Sumi, Tokyo-to, Japan, assignor to Nippon Telegraph and Telephone Public Corporation, Tokyo-to, Japan, a public corporation of Japan Filed Apr. 19, 1967, Ser. No. 632,022
Claims priority, application Japan, Apr. 25, 1966, 41/25,913
10 Claims. (Cl. 330—5)

ABSTRACT OF THE DISCLOSURE

A device provided with a slow-wave circuit and a semiconductor plate or rod, such as n-type InSb or n-type GaAs, working under a high DC electric field; where at least one microwave travelling along the slow-wave circuit is amplified by the coupling with an electron stream which is drifting in the semiconductor plate at a drift velocity slightly higher than the phase velocity of the slow wave travelling along the slow-wave circuit in the longitudinal direction thereof.

This invention relates to a microwave semiconductor device capable of amplifying at least one microwave and more particularly to such a device operatable in coupling between an electron stream in a homogenous semiconductor and a circuit wave travelling along a slow-wave circuit in the same direction as the electron stream.

There have been heretofore proposed microwave semiconductor devices of the type, such as ultrasonic amplifiers and amplifiers using negative resistance of a semiconductor. The amplification of the former device is due to the coupling between the electron stream and the ultrasonic wave in the semiconductor, so that the device requires an electroacoustic transducer and an acousto-electric transducer at both ends of the semiconductor respectively for coupling with external means. The latter, on the other hand, is operable when the semiconductor exhibits a negative resistance. Accordingly, it is necessary to apply a high DC electric voltage so as to cause the negative resistance to the semiconductor as is disclosed in a copending application of U.S. patent (Ser. No. 601,416, filed on Dec. 13, 1966 by me and other joint inventors) assigned to Nippon Telegraph & Telephone Public Corporation. Besides, since the semiconductor itself becomes active in such a condition only, self-sustaining oscillations are liable to occur while these oscillations must be suppressed for stable amplification.

A principal object of this invention is to provide a microwave semiconductor device stably amplifying input microwaves in an active unidirection.

Another object of this invention is to provide a microwave semiconductor device of small size operatable as a unidirectional amplifier in a wide frequency band of microwaves.

Another object of this invention is to provide a microwave semiconductor device of small size operatable as a self-oscillator in a wide frequency band of microwaves.

The objects of this invention can be attained by a microwave semiconductor device of this invention, comprising a slow-wave circuit having a travelling length considerably longer than the wave length of a slow wave travelling along the slow-wave circuit, a first coupling means for coupling an external path of microwave with one end portion of the slow-wave circuit, a second coupling means for coupling an external load impedance of microwave with the other end portion of the slow-wave circuit, a homogenous single crystal semiconductor having a length considerably longer than the wave length of the slow wave and being disposed closely in parallel with the slow-wave circuit, the semiconductor being capable of realizing therein a condition in which the drift velocity of the electrons substantially increases as the intensity of a DC field applied thereto is increased in a range of the intensity, insulation means for insulating between the slow-wave circuit and the semiconductor, and excitation means comprising a DC source for applying a DC high voltage in said range across the both ends of the semiconductor through ohmic contacts so as to make the drift velocity of the electrons in the semiconductor greater than the phase velocity of the slow-wave circuit, the number of said electrons being greater than that of positive holes in the semiconductor.

The novel features of this invention are set forth with particularity in the appended claims, however this invention, as to its construction and operation together with other objects and advantages thereof, may best be understood by reference to the following description, taken in connection with the accompanying drawings, in which the same parts are designated by the same characters, numerals and symbols as to one another, and in which:

Figure 1:
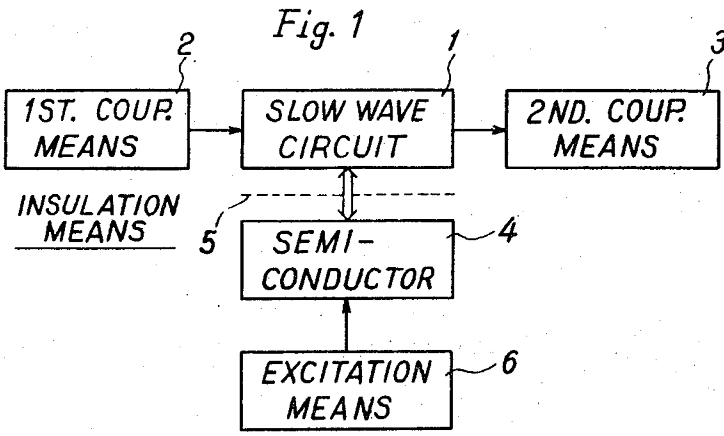
FIGURES 1 and 3 are respectively block diagrams for describing embodiments of this invention.

Referring to FIGURE 1, the construction principle of the semiconductor device of this invention for amplifying at least one input microwave will now be described. The device of this invention shown in FIGURE 1 comprises a slow-wave circuit 1, a first coupling means 2, a second coupling means 3, a semiconductor 4, insulation means 5 and excitation means 6. The slow-wave circuit 1 is formed so as to have an alternative circuit configuration and defines a sinous path, such as a meander line a ladder-type circuit, a helix-type circuit, etc., in each of which the microwave propagates at a speed much slower than the velocity of light, and it has a travelling length considerably longer than the wave length of a slow wave travelling along this slow-wave circuit 1. The first coupling means 2 is coupled to one end portion of the slow-wave circuit 1 and employed for applying at least one input microwave to the slow-wave circuit 1. The second coupling means 3 is coupled to the other end portion of the slow-wave circuit 1 and employed for deriving, from the slow-wave circuit 1, at least one microwave which is an output signal amplified according to an amplification principle as will be described hereinafter. The semiconductor 4 is a homogenous semiconductor plate or rod of a single crystal which has a length considerably longer than the wave length of the slow wave and is disposed closely in parallel with the slow-wave circuit 1 so as to closely couple in the high frequency range. In this case, it is desirable that the longitudinal direction of the semiconductor 4 is arranged in parallel with the travelling length of the slow-wave circuit 1. Semiconductors of a single crystal having a considerably high mobility of conduction electrons, such as n-type InSb or n-type GaAs, are suitable as the semiconductor 1. In such semiconductors, a condition in which the drift velocity of the electrons substantially increases as the intensity of a DC electric field applied thereto is increased is realized. An insulation layer, such as a layer of mica or high-polymer having a low dielectric loss in the microwave range, is disposed between the slow-wave circuit 1 and the semiconductor 4 as the insulation means 5. The excitation means 6 applies a DC high voltage across the both ends of the semiconductor 4 through ohmic contacts so that the drift velocity of the electrons in the semiconductor 4 becomes greater than the phase velocity of the slow-wave travelling in the slow-wave circuit 1. By way of example, the drift velocity of electrons is of about $6\times 10^7$ centimeters/second or about $1\times 10^7$ centimeters/second when a DC field of nearly 300 volts/centimeter or of nearly 3000 volts/centimeter is applied to n-type InSb at liquid nitrogen temperature or n-type GaAs at room temperature respectively. The slow-wave circuit 1 is so designed that the phase velocity of the slow-wave is approximately equal to the drift velocity of electrons. As an actual example, the pitch of the slow-wave circuit is chosen to be about 20 microns in case of InSb for the frequency 4 gigacycles and in case of GaAs for the frequency 2 gigacycles.

In said formation, the slow wave propagating in the Z-direction varies as a function:

$$\exp\,[j(\omega t-\beta_1 z)]\cdot\exp\,[\beta_2 z]$$

where $j$ is $\sqrt{-1}$, so that the notation $\beta_1$ is a real propagation constant and the notation $\beta_2$ is an amplification constant, which are represented as follows:

$$\frac{2\beta_1^2}{\beta_c^2}=1+\frac{\epsilon_2}{\epsilon_1}\cdot\frac{\left(1-\frac{\beta_1 u}{\omega}\right)^2+\left(\frac{\omega_d\beta_D}{\omega_D\beta_1}\right)}{\left(1-\frac{\beta_1 u}{\omega}\right)^2+\left(\frac{\omega_d}{\omega_D}\right)} \quad (1)$$

$$\frac{4\beta_1^2}{\beta_c^2}\cdot\frac{\beta_2}{\beta_1}=-\frac{\epsilon_2}{\epsilon_1}\cdot\frac{\frac{\omega_d}{\omega}\left(1-\frac{\beta_1 u}{\omega}\right)}{\left(1-\frac{\beta_1 u}{\omega}\right)^2+\left(\frac{\omega_d}{\omega_D}\right)} \quad (2)$$

where $\beta_c$=the characteristic propagation constant of the slow-wave circuit;

$u$=the drift velocity of electrons in the semiconductor;

$\omega$=the angular frequency of the travelling wave;

$\epsilon_1$=the dielectric constant of the medium surrounding the semiconductor and the slow-wave circuit;

$\epsilon_2$=the dielectric constant of the semiconductor;

$\omega_d$=the dielectric relaxation frequency of the semiconductor;

$\omega_D$=the diffusion frequency of the semiconductor; and $\beta_D$=the Debye wave-number of the semiconductor.

Figure 2:
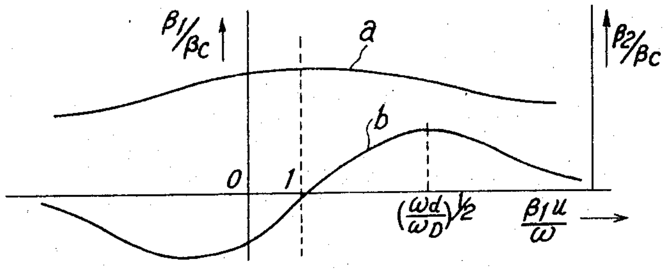
FIGURE 2 is a diagram of characteristic curves for describing the operation of the embodiment of this invention.

Equations 1 and 2 give characteristics of the ratios $\beta_1/\beta_c$ and $\beta_2/\beta_c$ against the drift velocity $u$ as are shown by curves $a$ and $b$ respectively in FIGURE 2. Waves travelling in the direction of the drift velocity have the sign of $\beta_1$ as same as that of $u$ and have a smaller attenuation as the drift velocity of electrons in the semiconductor 4 increases, so that they are amplified when the drift velocity exceeds the phase velocity of the propagating slow-waves. On the contrary, waves travelling in the reverse direction of the drift velocity have the sign of $\beta_1$ opposite to that of $u$ and are always attenuated.

As the result of the above-mentioned principle, travelling waves are amplified if the direction of the drift velocity of electrons coincides with the direction of the travelling direction of the slow-wave, in other words, if the direction of the DC electric field is reverse to the direction of the travelling direction. Accordingly, if at least one input microwave is applied to the slow-wave circuit 1 through the first coupling means 2, the microwave travels along the slow-wave circuit 1 from the one end portion to which the first coupling means 2 is coupled to the other end portion to which the second coupling means 3 is coupled and is amplified in the slow-wave circuit 1 by the interaction of slow-waves with the drifting electrons in the semiconductor 4. The microwave amplified is derived, through the second coupling means 3, from the slow-wave circuit 1. Since it is easily realized that the first coupling means 2 and the second coupling means 3 have hardly mutual coupling to each other in the actual case, the amplification operation in the device of this invention can be carried out stably without risk of oscillation. By enlarging the length along which the stream of electrons in the semiconductor 4 and the slow-wave in the slow-wave circuit 1 interact with each other, the amplification gain of the device can be increased.

As the slow-wave circuit 1, any type of circuit such as ladder-type, comb-type or a helix type can be employed. Since the slow-wave circuit 1 is operable in a wide frequency band, the device with the slow-wave circuit 1 is also operable in a wide frequency band. The circuit is designed as to couple the fundamental wave with the stream of electrons in the semiconductor. However, if necessary, the slow-wave circuit 1 can be designed so that spatial harmonic waves produced by the slow-wave circuit 1 are coupled to the stream of electrons in the semiconductor 4. In this case, since the pitch of the slow-wave circuit 1 is larger than that of the case of the fundamental wave, the slow-wave circuit 1 can be easily designed.

Figure 3:
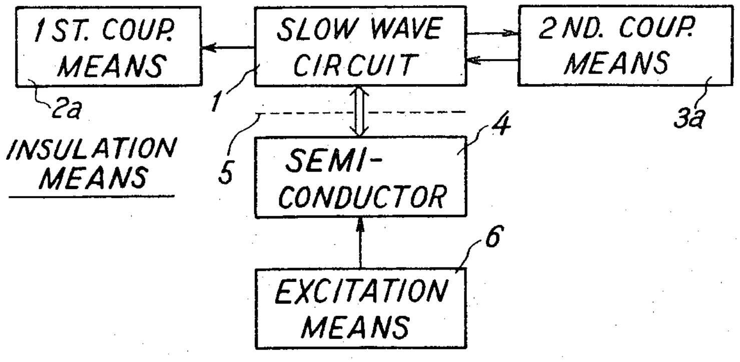

The principle of another embodiment of this invention will be described with reference to FIGURE 3. In the slow-wave circuit 1, backward waves can travel that have the phase velocity directed in the direction of the drift velocity in the semiconductor 4 but the group velocity directed in the reverse direction of the drift velocity of the semiconductor 4. If a certain mode of backward waves can be coupled to the semiconductor 4 by adjusting the intensity of the DC field, self-sustaining oscillation is generated in a similar way as a backward-wave oscillator using a travelling-wave-tube. Accordingly, the output microwave is derived through a first coupling means 2*a* from the one end portion of the slow-wave circuit 1 which would play as the input side in the formation shown in FIGURE 1, if the other end of the slow-wave circuit 1 is connected, through a second coupling means 3*a*, to a matched load (not shown) to which the microwaves travelled are completely absorbed. Even though the matched load is not connected to the second coupling means 3*a*, the microwaves travelling are substantially absorbed at the second coupling means 3*a*. The operating frequency can be considerably changed in accordance with the change of DC voltage applied to the semiconductor 4 so that the device of this type is tunable widely in frequency in changing the applying voltage of the semiconductor 4.

In this embodiment of the invention also, the slow-wave circuit 1 may be designed so that spatial harmonic waves produced by the slow-wave circuit 1 are coupled to the stream of electrons in the semiconductor 4.

Figure 4:
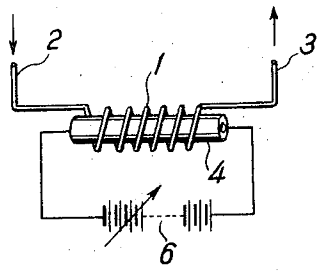
FIGURE 4 is a perspective view for describing the constitutional principle of an actual embodiment of this invention.

In order to make the construction of embodiments of this invention clear, an actual example of the device of this invention will be described in brief with reference to FIGURE 4. The actual example of this invention is composed of a semiconductor rod 4 of a single crystal, a slow-wave circuit 1 of helix-type wound around the semiconductor rod 4, a DC voltage source 6 to be employed as the excitation means 6 to apply a DC field across the semiconductor 4. Through ohmic contacts, one and the other ends of the slow-wave circuit 1 are respectively connected to a first coupling means 2 and a second coupling means 3. The slow-wave circuit 1 and the semiconductor rod 4 are insulated from each other by use of an insulator (not shown).

If the intensity of the DC field is adjustable by adjusting the voltage across the semiconductor 4 by means of a control means, such as variable resistor, the drift velocity of the stream of electrons is precisely adjustable so as to couple with a desirable slow-wave travelling in the slow-wave circuit. This control means can be also applied to the embodiment corresponding to the block diagram shown in FIGURE 3.

Figure 5A:
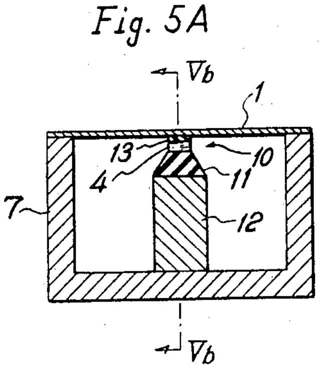
FIGURE 5A is a sectional view of an actual embodiment of this invention shown in FIGURE 5B along a line V*a*—V*a*.
Figure 5B:
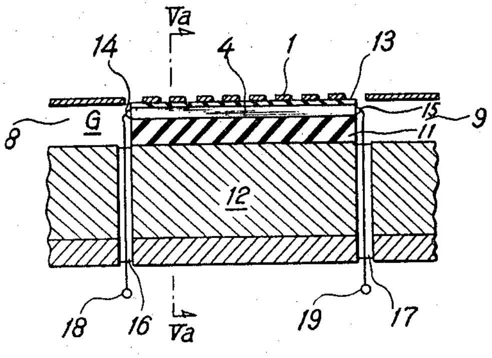
FIGURE 5B is a sectional view of the actual embodiment of this invention shown in FIGURE 5A along a line V*b*—V*b*.
Figure 5C:
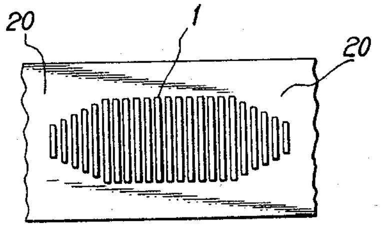
FIGURE 5C is a plan view for illustrating a slow-wave circuit to be employed for the embodiment shown in FIGURES 5A and 5B.

Referring to FIGURES 5A, 5B and 5C, an actual example of the device of this invention corresponding to the block diagram shown in FIGURE 1 will now be described. The device of this example is formed by use of a wave guide 7 of the rigid-type having a narrow gap 10 which is substantially parallel with H-plane of the wave guide 7. A single crystal semiconductor plate 4 is supported in the narrow gap 10 on an insulator 11 which is thermally contacted to the top of a ridge 12. Insulative materials, such as berillia having a good characteristic of heat conduction and a low dielectric loss in the microwave range, are suitable as the insulator 11. The slow-wave circuit 1 of this example is formed as a part of the wave guide 7 as is shown. The semiconductor plate 4 is also insulated by a thin insulation layer 13 of the insulation means 5 from the slow-wave circuit 1. At each end of the semiconductor plate 4, a connection line is soldered so as to form an electrode 14 or 15 of ohmic contact. In the ridge 12, there are provided two holes 16 and 17 through each of which a connection line is passed to connect between a terminal 18 or 19 of a DC source 6 (not shown) and the electrode 14 or 15. FIGURE 5C shows an example of the slow-wave 1 to be employed in the embodiment, in which tapered parts 20 of both ends of the ladder-type circuit shown are provided so as to make the input and output microwaves to match with the slow-wave circuit 1. The slow-wave circuit 1 of this type can be formed by a photoetching technique. In this embodiment, at least one input microwave applied to the one end 8 (the inlet) of the wa ve guide 7 is amplified in travelling along the slow-wave circuit 1 the slow-wave of which is coupled with the stream of electrons in the semiconductor 4. The microwave amplified is derived from the other end 9 (the outlet) of the wave guide 7.

Figure 6A:
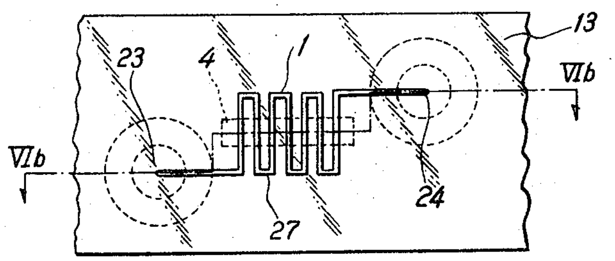
FIGURE 6A is a sectional view of a section along a line VI*a*—VI*a* of another actual embodiment of this invention shown in FIGURE 6B.
Figure 6B:
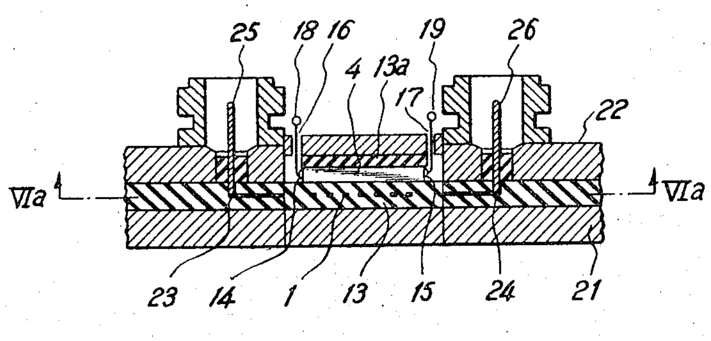
FIGURE 6B is a section view along a line VI*b*—VI*b* in FIGURE 6A.

Referring to FIGS. 6A, 6B and 6C, another embodiment of this invention corresponding to the block diagram shown in FIGURE 1 will be described. In this embodiment, there is provided a slow-wave circuit 1 which is a center line of a microwave strip line circuit of a three-wire system and is supported, by use of an insulator 13, between two metal bases 21 and 22 of outer conductors. Terminals 23 and 24 of the slow-wave circuit 1 are respectively connected to a connector 25 of a coaxial line for the input microwave and a connector 26 of a coaxial line for the output microwave. These connectors 25 and 26 are fixed on one of the outer conductors 21 and 22. A semiconductor plate 4 is disposed on the surface of the insulator 13 and insulated, by use of an insulator 13*a*, from the outer conductor 22 so that the semiconductor plate 4 is coupled with a middle part of the slow-wave circuit 1 as is shown in FIGURE 6B. The DC field is applied to the semiconductor 4 through electrodes 14 and 15 of ohmic contacts which are connected respectively to terminals 18 and 19 of a DC source through holes 16 and 17.

Figure 7A:
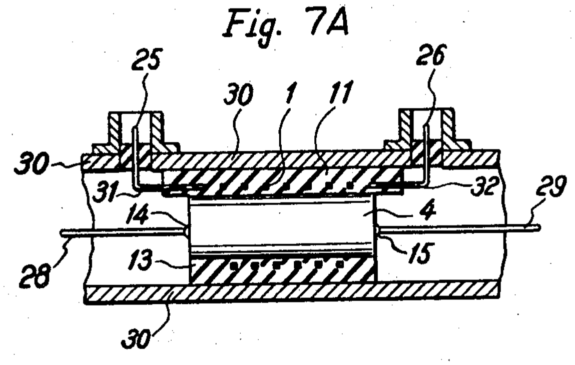
FIGURE 7A is a section of another actual embodiment of this invention shown in FIGURE 7B along a plane VII*a*.
Figure 7B:
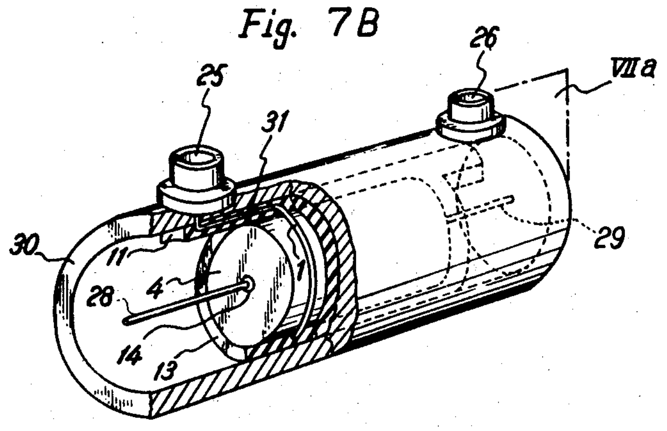
FIGURE 7B is a fragmental perspective view of the actual embodiment of this invention shown in FIGURE 7A.

Referring to FIGURES 7A and 7B, another example of the device of this invention corresponding to the diagram shown in FIGURE 1 will be described. In this embodiment, the semiconductor 4 is formed into a cylindrical shape, at opposite ends of which electrodes 14 and 15 are provided to apply a DC field to the semiconductor 4 through the connection lines 28 and 29 respectively. The slow-wave circuit 1 is a helix type circuit which is wound coaxially around the semiconductor 4 and insulated by an insulation layer 11 from both the semiconductor 4 and the metal wall 30. The one end portion 31 and the other end portion 32 of the helix 1 are respectively connected to the connectors 25 and 26 of coaxial lines which are respectively employed as the first coupling means 2 and the second coupling means 3.

Figure 8A:
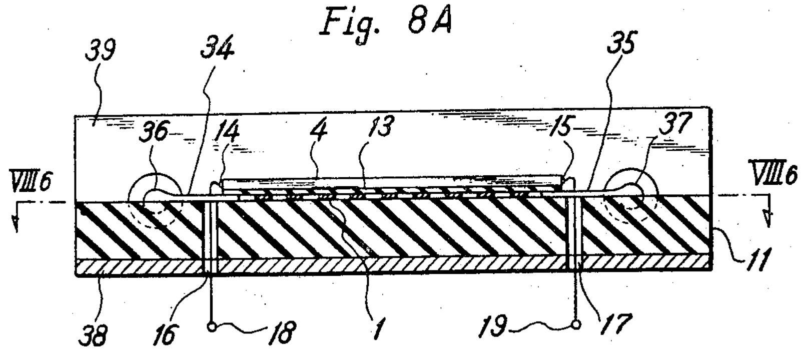
FIGURE 8A is an elevation view including partial sections, along a line VIII*a*—VIII*a* in FIGURE 8B for illustrating another embodiment of this invention.
Figure 8B:
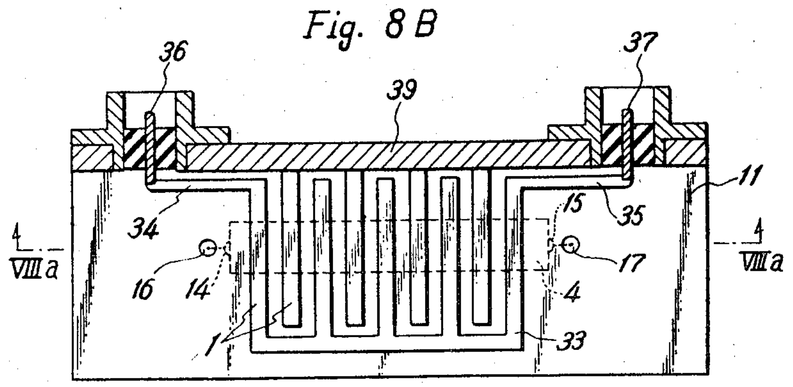
FIGURE 8B is a section view along a section line VIII*b*—VIII*b* in FIGURE 8A.

Referring to FIGS. 8A and 8B, an actual example of the device of this invention corresponding to the block diagram shown in FIGURE 3 will now be described. In this embodiment, there is provided the slow-wave circuit 1 which is an interdigital-type circuit 33 suitable for backward-wave operation as is shown in FIGURE 8B. The slow-wave circuit 1 is disposed on an insulator 11 which is fixed on a metal base 38. A metal base 39 is disposed along the side of the insulator 11 at right angles with the metal base 38 and employed for supporting coaxial connectors 36 and 37. An insulation layer 13 is inserted between the slow-wave circuit 1 and the semiconductor 4. One end portion 34 of the slow-wave circuit 1 is connected to the output coaxial line 36, and the other end portion 35 of the slow-wave circuit 1 is connected to the other coaxial line 37 which may be terminted with a matched dummy load. The DC field is applied to the semiconductor 4 through electrodes 14 and 15 of ohmic contacts which are connected respectively to terminals 18 and 19 of a DC source through holes 16 and 17. The microwave generated as the result of coupling between the stream of electrons in the semiconductor 4 and the backward waves travelling along the slow-wave circuit 33 can be derived from the output coaxial line 36.

Since it is obvious that many changes and modifications can be made without departing from the nature and spirit of this invention, it is to be understood that the invention is not to be limited to the details described herein except as set forth in the appended claims.

What I claim is:

1. A microwave semiconductor device, consisting of a slow-wave circuit defining a sinuous path of a wave travelling therethrough and having a travelling length considerably longer than the wave length of a slow-wave travelling along the slow-wave circuit, a first input coupling means for coupling an external path of a microwave with one end portion of the slow-wave circuit, a second coupling means for deriving therefrom an amplified microwave output and coupling an external load impedance of microwave with the other end portion of the slow-wave circuit, a homogeneous, single crystal n-type semiconductor having a length considerably longer than the wave length of the slow wave and being disposed closely in parallel with the slow-wave circuit, the semiconductor being capable of realizing therein a condition in which the drift velocity of the electrons therein substantially increases as the insensity of a DC field applied thereto is increased in a range of intensity, insulation means insulating between the slow-wave circuit and the semiconductor, and excitation means comprising a DC source applying a DC voltage in said range across both ends of the semiconductor including ohmic contacts so as to make the drift velocity of the electrons in the semiconductor greater than the phase velocity of a slow-wave travelling in said slow-wave circuit and the number of said electrons being greater than that of positive-holes in the semiconductor.

2. A microwave semiconductor device according to claim 1, in which said first coupling means comprises means by which at least one input microwave is applied to the slow-wave circuit and the directions of the phase velocity and group velocity of the slow-wave coincide with the direction of the drift velocity of the conduction electrons in the semiconductor, whereby the microwave is emplified in travelling along the slow-wave circuit and the amplified microwave is derived through the second coupling means.

3. A microwave semiconductor device according to claim 2, in which the device comprises a wave guide of ridge-type having a narrow gap which is substantially parallel with an H-plane of the wave guide, a plate of the semiconductor supported in the narrow gap, a support insulator for said plate thermally contacted to the ridge of the wave guide, said wave guide having an inlet employed as the first coupling means and an outlet on the wave guide employed as the second coupling means.

4. A microwave semiconductor device according to claim 2, in which the slow-wave circuit defines a center line of a microwave strip line of three-wire system, the first and second coupling means despectively comprising coaxial connectors fixed on one of the outer conductors of the strip line and connected to respective end portions of the slow-wave circuit, the semiconductor being insulatively supported between the slow-wave circuit and one of the outer conductors.

5. A microwave semiconductor device according to claim 2, in which the device semiconductor comprises a cylindrical conductor along the axis of which a rod of the semiconductor is fixed by means of an insulator, the slow-wave circuit being a helix wound around the cylindrical semiconductor and supported in the insulator, the first and second coupling means being respectively coaxial connections fixed on the cylindrical conductor and connected to respective end portions of the slow-wave circuit.

6. A microwave semiconductor device according to claim 2, in which the slow-wave circuit comprises means effective so that spacial harmonic waves produced by the slow-wave circuit are coupled to the stream of electrons in the semiconductor.

7. A microwave semiconductor device according to claim 1, in which the slow-wave circuit comprises means in which the direction of the group velocity of the travelling slow-wave is reverse to the direction of the drift velocity of the conduction electrons in the semiconductor while the direction of the phase velocity of the travelling slow wave is the same as the direction of the drift velocity of the conduction electrons in the semiconductor, whereby a microwave is generated in the slow-wave circuit and derived through the first coupling means.

8. A microwave semiconductor device according to claim 7, in which a matched load is connected to the second coupling means.

9. A microwave semiconductor device according to claim 7, in which the slow-wave circuit comprises means effective so that spacial harmonic wave produced by the slow-wave circuit are coupled to the stream of electrons in the semiconductor.

10. A microwave semiconductor device according to claim 7, in which the device is provided with control means for adjusting the intensity of the DC field.

References Cited

UNITED STATES PATENTS

| | | | |
|---|---|---|---|
| 2,760,013 | 8/1956 | Peter | 330—5 |
| 3,008,089 | 11/1961 | Uhlir | 330—4.6 |
| 3,092,782 | 6/1963 | Chang | 330—4.6 |
| 3,173,102 | 3/1965 | Loewenstern | 330—5 |
| 3,200,354 | 8/1965 | White | 330—5.5 |
| 3,270,241 | 8/1966 | Vural | 330—5 |

ROY LAKE, *Primary Examiner.*

D. R. HOSTETTER, *Assistant Examiner.*